(12) United States Patent  
Tsuji

(10) Patent No.: US 8,153,530 B2  
(45) Date of Patent: Apr. 10, 2012

(54) METHOD OF MANUFACTURING A SEMICONDUCTOR DEVICE

(75) Inventor: Yukihiro Tsuji, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 733 days.

(21) Appl. No.: 12/314,603

(22) Filed: Dec. 12, 2008

(65) Prior Publication Data

US 2009/0170327 A1   Jul. 2, 2009

(30) Foreign Application Priority Data

Dec. 28, 2007  (JP) .................. 2007-340334

(51) Int. Cl.  
*H01L 21/302* (2006.01)

(52) U.S. Cl. .................. 438/736; 438/714; 438/717

(58) Field of Classification Search .................. 438/706, 438/712, 714, 717, 718, 735, 736; 216/41, 216/48

See application file for complete search history.

(56) References Cited

U.S. PATENT DOCUMENTS

2003/0017424 A1* 1/2003 Park et al. .................. 430/322  
2003/0215577 A1* 11/2003 Willson et al. .................. 427/458  
2007/0018199 A1* 1/2007 Sheppard et al. .................. 257/200  
2007/0037307 A1* 2/2007 Donofrio .................. 438/42

FOREIGN PATENT DOCUMENTS

JP         2000-323461         11/2000

* cited by examiner

*Primary Examiner* — Lan Vinh  
(74) *Attorney, Agent, or Firm* — Smith, Grambell & Russell, LLP

(57) ABSTRACT

In this method of manufacturing a semiconductor device, the remaining layer of an etching mask layer remains in a predetermined thickness when the stamping face of a nano-stamper is pressed on the surface of the etching mask layer. Therefore, the remaining layer of the etching mask layer functions as a cushion so that the stress added to the nano-stamper and the semiconductor substrate is reduced. Accordingly, the crystal defect that might otherwise be introduced in the semiconductor substrate in pressing the nano-stamper on the semiconductor substrate can be restrained, resulting in suppression of the degradation of optical characteristics of the semiconductor device. Also, since the nano-stamper can be prevented from being damaged, extra steps such as the replacement of the nano-stamper can be avoided.

11 Claims, 14 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device that includes an optical grating having a periodic corrugation pattern.

2. Related Prior Art

It is well known in the field of micro-processing technologies that a dual light flux interferential exposure method and an electron beam exposure method have mainly be used for forming an optical grating in a semiconductor device. On the other hand, an optical nano-imprint technique has recently been developed as a new method for forming a fine pattern.

A technique known as such a nano-imprint technology is a method of forming a fine pattern as disclosed in Japanese Patent Application Publication No. 2000-323461, for example. According to this conventional method of forming a fine pattern, a mold (nano-stamper) for nano-imprint is formed on a mold board having a mark for positional reference, and a mask layer is formed on the semiconductor substrate. By pressing a nano-stamper onto this mask layer, a fine pattern formed on the nano-stamper is transferred onto the mask layer. Thereafter, by performing the RIE etching using the mask layer, the fine pattern is formed on the surface of the semiconductor substrate.

SUMMARY OF THE INVENTION

To date, however, the nano-imprint technique is hardly adopted as a way of forming an optical grating. Furthermore, in the above-described method, the semiconductor substrate and the nano-stamper tend to be damaged when a fine pattern is formed using the nano-imprint technique.

The object of the present invention is to provide a method for making an optical grating and a semiconductor device having an optical grating, in which method the nano-stamper and the semiconductor device can be prevented from suffering the above-mentioned damage when the optical grating is formed using the nano-imprint technique.

In order to solve the above-mentioned problems in a method of manufacturing a semiconductor device having an optical grating, the method of the present invention for manufacturing a semiconductor device comprises:

a step of forming an optical grating layer on a semiconductor substrate (hereinafter, referred to as "optical grating layer forming process");

a step of forming an etching mask layer on the optical grating layer;

a step of preparing a nano-stamper having a stamping face including a periodic corrugation pattern, and subsequently pressing the stamping face of the nano-stamper onto the surface of the etching mask layer such that the remaining layer from the top surface of the stamping face to the surface of the optical grating layer remains in a predetermined thickness;

a step of forming a mask pattern by removing the remaining layer of the etching mask layer by dry etching using plasma (hereinafter referred to as the "remaining layer removing process"); and a step of forming an optical grating on the optical grating layer by etching an optical grating layer using the etching mask layer as a mask.

In this method of manufacturing a semiconductor device, the remaining layer of the etching mask layer remains in a predetermined thickness when the stamping face of the nano-stamper is pressed onto the surface of the etching mask layer. Therefore, the remaining layer of the etching mask layer works as a cushion so that the stress added to the nano-stamper and the semiconductor substrate is reduced. Accordingly, this method for manufacturing a semiconductor device suppresses introducing the crystal defect into the active layer and the semiconductor substrate. As a result, the degradation of optical characteristics of the semiconductor device is restrained. Also, the nano-stamper can be prevented from being damaged.

Preferably, the remaining layer of the etching mask layer is 10 nm or more and 100 nm or less in thickness. If the remaining layer of the etching mask layer having a thickness of 10 nm or more is made, it works as a cushion, and consequently introducing a crystal defect in the active layer and the semiconductor substrate may be suppressed. And the thickness necessary for reducing the degradation of the optical characteristics of the semiconductor device can be secured. Also, the remaining layer of the etching mask layer is so thin as to be equal to or less than 100 nm in thickness. So, the remaining layer of the etching mask layer can be quickly removed. Therefore, the precision of the corrugation pattern formed in the etching mask layer can be maintained.

Preferably, the etching mask layer is composed of two layers of a first layer that is formed on an optical grating layer and a second layer that is formed on the first layer, wherein the second layer is made of a UV-curing resin. And the first layer is made of resin that has an etching rate greater than that of the second layer at the time of the dry etching of the first layer. In such case, the periodic pattern formed in the etching mask layer is precisely maintained when the remaining layer of the etching mask layer is removed by dry etching.

When the etching mask layer is composed of two-layer structure, the first layer may be made of resin containing polyacrylate as a major ingredient, and the second layer may be made of a UV-curing resin containing silylation product as a major ingredient. In this case, the remaining layer of the etching mask layer is also composed of the first layer and a part of the second layer. Dry etching using $O_2$ plasma is used for removing the first layer in the remaining layer. If the etching mask layer is constituted of the above-mentioned two resins in combination, the etching rate of the first layer can be set greater than the etching rate of the second layer at dry etching process using $O_2$ plasma. Then, the mask pattern of the corrugation is not deformed because the mask pattern is composed of the two-layer structure, and the first layer in the remaining layer is selectively removed by dry etching using $O_2$ plasma. Preferably, dry etching using $CF_4$ plasma is used for removing the second layer in the remaining layer. The etching rate of the second layer can be set greater than the etching rate of the first layer at dry etching process using $CF_4$ plasma. Then, the second layer is selectively removed, and dry etching process to remove the second layer is automatically stopped when the first layer is exposed.

Between the process of forming an optical grating layer and the process of forming an etching mask layer, it is preferable to provide a process of forming stoppers (i.e., projections) in a region outside of the region where the optical grating is to be formed on the optical grating layer. The thickness of the stoppers is preferably equal to or more than 10 nm. The nano-stamper contacts with the stoppers when the nano-stamper is pressed on the etching mask layer. Then, the stoppers regulate the stroke of the nano-stamper. Consequently, it is possible to easily make the remaining layer of the etching mask layer to have a thickness of 10 nm or more. A dielectric film made of silicon nitride ($Si_3N_4$), silicon oxide ($SiO_2$) or silicon oxynitride (SiON) can be used as a material for making the stoppers.

In the case of the etching mask layer composed of a two-layer structure, it is preferable that the first layer is formed to be thicker than the stopper. The thickness of the remaining layer is controlled by the thickness of the stopper. The remaining layer having the predetermined thickness is easily obtained after pressing the nano-stamper into the etching mask layer.

It is preferable that the stopper having the predetermined thickness is integrally formed in the region outside the stamping face on the nano-stamper. The thickness of the stopper is preferably 10 nm or more, for example. Also in this case, the stoppers contact with the optical grating layer when the nano-stamper is pressed on the etching mask layer. Then, the stroke of the nano-stamper is regulated by the stopper. Accordingly, the remaining layer of the etching mask layer can easily be made to have a predetermined thickness of 10 nm or more. In this case, preferably the first layer is formed in a thickness that is greater than the height of the stopper formed on the nano-stamper.

The present invention will be more fully understood from the detailed description given hereinbelow and the accompanying drawings, which are given by way of illustration only and are not to be considered as limiting the present invention.

Further, the scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from the detailed description.

BRIEF DESCRIPTION OF THE DRAWINGS

FIG. 9b is a sectional view taken along the line II-II of FIG. 5 and showing the processes subsequent to the process of FIG. 9a.

DESCRIPTION OF THE PREFERRED EMBODIMENTS

Figure 1:
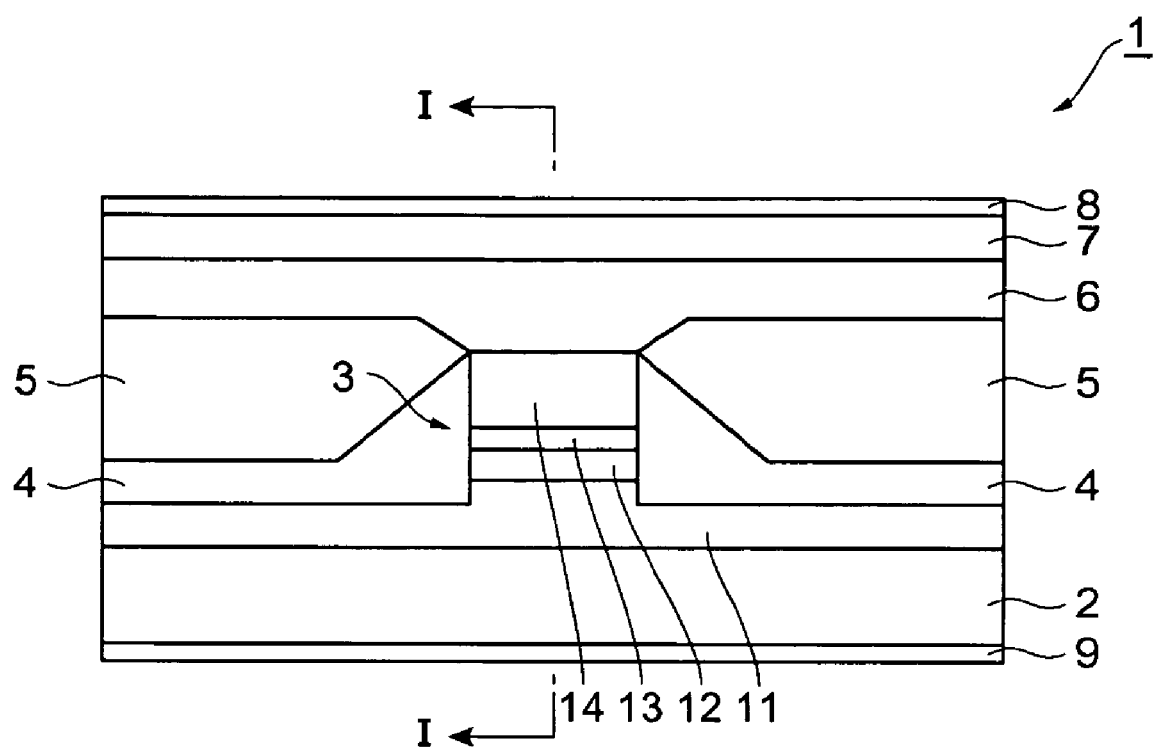
FIG. 1 is a sectional view of a semiconductor laser device prepared using a method of manufacturing a semiconductor device according to the present invention.

Hereinafter, preferred embodiments of manufacturing methods for a semiconductor device relating to the invention will be described in detail in reference to the accompanying drawings. In the explanation of the drawings, an identical mark is put on the same element, and the repetition of explanation will be omitted. The dimensional ratios in the drawings do not always correspond with those of the description.

In the case of forming an optical grating pattern using a conventional optical nano-imprint technique, a UV-curing resin is mainly used as a resin for making a mask layer. Therefore, a nano-stamper made of silica is used because the silica is transparent to the ultraviolet rays. In other words, in this optical nano-imprint technique, a nano-stamper made of silica that is a hard material is pressed onto the surface of the semiconductor crystal that is hard like such material.

When the nano-stamper is, for example, pressed onto the semiconductor wafer which has a semiconductor layer formed on the semiconductor substrate, the stress is applied to the wafer. Then, the crystal defect will be introduced in the semiconductor wafer due to the strain caused by the stress. The characteristics of the semiconductor device fabricated by the conventional optical nano-imprint technique might be degraded because the defect is introduced in the semiconductor device at the stamping process. Also, the excessive stress is added to the nano-stamper, and it damages the fragile stamper with a fine pattern.

Figure 2:
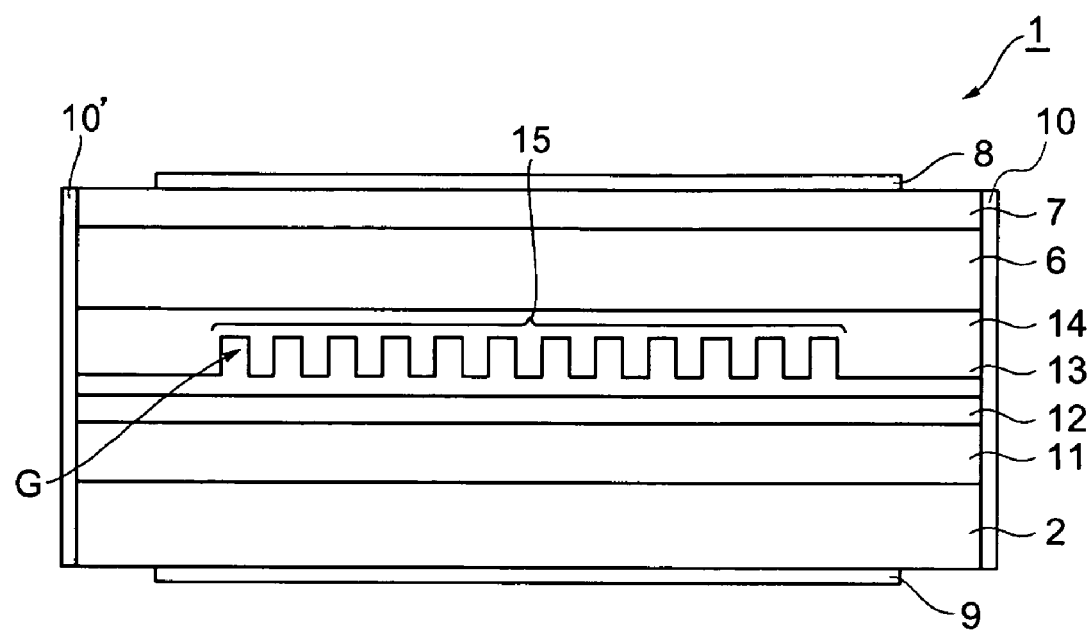
FIG. 2 is a sectional view taken along the line I-I of FIG. 1.

FIG. 1 schematically illustrates a cross-section of a semiconductor laser device prepared according to an embodiment of the present invention. Also, FIG. 2 is a sectional view taken along the line I-I of FIG. 1. The semiconductor laser device 1 shown in FIG. 1 is a distributed feedback laser diode (hereinafter denoted as DFB-LD) having a lasing wavelength of 1.55 μm. A DFB-LD operates at a stable single mode or single wavelength. A DFB-LD is used as an optical source for a long-haul optical communication system.

As shown in FIGS. 1 and 2, a semiconductor laser device 1 comprises a semiconductor substrate 2 and a semiconductor mesa part 3 formed on one face side of the semiconductor substrate 2. The both sides of the semiconductor mesa part 3 are embedded with buried layers 4 and 5. Moreover, the semiconductor laser device 1 has a cladding layer 6, which covers the surfaces of the semiconductor mesa part 3 and the buried layer 5, and a contact layer 7, which covers the surface of the cladding layer 6. In addition, an electrode 8 is formed on the surface of the contact layer 7, and an electrode 9 is formed on the surface of the semiconductor substrate 2 on the other side. An anti-reflection coating film 10 is formed on the end facet of the semiconductor laser device 1, and a high-reflection coating film 10' is formed on the other end facet of the semiconductor laser device 1. The semiconductor substrate 2 is a Sn-doped n-type InP substrate. The thickness of the semiconductor substrate 2 is about 100 μm. The semiconductor mesa part 3 is constituted of an n-type cladding layer 11, an active layer 12, an optical grating layer 13, and a p-type cladding layer 14, which are stacked one on top of the other in the order enumerated from the semiconductor substrate 2.

The semiconductor mesa part 3 is formed in a stripe configuration by etching a semiconductor region including the active layer 12.

The active layer 12 is made of non-doped InGaAsP. The active layer 12 has a multi-quantum well (MQW) structure. The carriers of electrons and holes are injected into the active layer 12 from the n-type cladding layer 11 and p-type cladding layers 6 and 14, respectively. The optical light is generated by the recombination of electrons and halls.

The n-type cladding layer 11 of the semiconductor mesa part 3 is a Si-doped n-type InP layer. The p-type cladding layer 14 is a Zn-doped p-type InP layer. The refractive indices of the n-type cladding layer 11 and the p-type cladding layer 14 are smaller than the refractive index of the active layer 12. Therefore, the n-type cladding layer 11 and the p-type cladding layer 14 confine light generated in the active layer 12.

The optical grating layer 13 is a Zn-doped p-type InGaAsP layer. An optical grating G having a periodic corrugation pattern 15 is formed in the optical grating layer 13 as shown in FIG. 2. The optical grating G includes the periodic corrugation pattern 15 extending along the stripe of the semiconductor mesa part 3. The depth of the periodic corrugation pattern 15 is about 30 nm, and the pitch of the corrugation is about 120 nm, for example.

In this embodiment, the optical grating G has a corrugation pattern 15 uniformly formed with a constant pitch; for other case, however, a $\lambda/4$ phase shift region may be provided in the periodic corrugation structure of the optical grating to produce a stable single wavelength oscillation.

The light generated in the active layer 12 propagates and amplifies in a longitudinal direction of the semiconductor mesa part 3. A part of the light is reflected toward the direction opposite to the light propagating direction by the optical grating formed in the optical grating layer 13, and propagates and amplifies in the direction opposite to the light propagating direction. The laser oscillation occurs due to the interaction between the propagation light and the reflection light. The wavelength of the reflected light is selected by the pitch of the corrugation pattern 15 of the optical grating G. Therefore, the semiconductor laser device 1 having the optical grating G operates on the single wavelength controlled by the pitch of the corrugation pattern 15.

The buried layer 4 is a Zn-doped p-type InP layer. The buried layer 4 covers the side portions of the cladding layer 12, the active layer 13 and cladding layer 14 in the semiconductor mesa part 3. The thickness of the buried layer 4 increases as it becomes closer to the sidewall of the semiconductor mesa part 3. The buried layer 5 is a Si-doped n-type InP layer. The buried layer 5 is formed so as to cover the surface of the buried layer 4, and the surface of the buried layer 5 is formed to be flat.

The cladding layer 6, which is a Zn-doped p-type InP layer, is formed on the buried layers 4 and 5 and the cladding layer 14 of the semiconductor mesa part 3. The light can be effectively confined inside the active layer 12 by the cladding layer 6 and the cladding layer 14.

The contact layer 7 is a Zn-doped p-type InGaAs layer. The contact layer 7 achieves ohmic contact with the electrode 8. The electrode 8 is made of a stacked metal of Ti/Pt/Au. The electrode 9 is made of an eutectic metal of AuGe/Ni. The electrode 8 is formed on the surface of the contact layer 7, and the electrode 9 is formed on the other surface of the semiconductor substrate 2.

The anti-reflection coating film 10 is a multi-layered film in which aluminum oxide ($Al_2O_3$), amorphous Si and aluminum oxide ($Al_2O_3$) films are alternately stacked. Preferably, the anti-reflection coating film 10 has a lower reflectivity than 1%. Also, the high-reflection coating film 10' is a multi-layered film in which aluminum oxide ($Al_2O_3$) and titanium oxide ($TiO_2$) films are alternately stacked.

Hereinafter, the method of manufacturing the semiconductor laser device 1 having the above-mentioned structure will be described in detail.

[Optical Grating Layer Forming Process]

Figure 3:
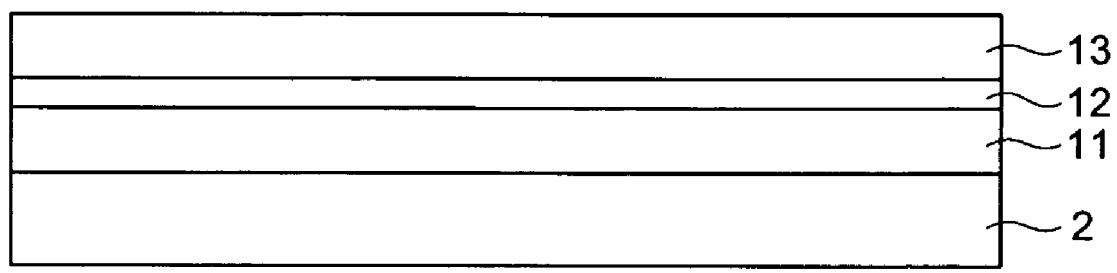
FIG. 3 is a sectional view showing one embodiment of the method of manufacturing a semiconductor laser device relating to the present invention.

First, a semiconductor substrate 2 made of Sn-doped InP is prepared as shown in FIG. 3. Next, a cladding layer 11, an active layer 12 and an optical grating layer 13 are grown on the semiconductor substrate 2 by a metalorganic chemical vapor deposition (MOCVD) method.

[Process of Forming Stoppers]

Figure 4:
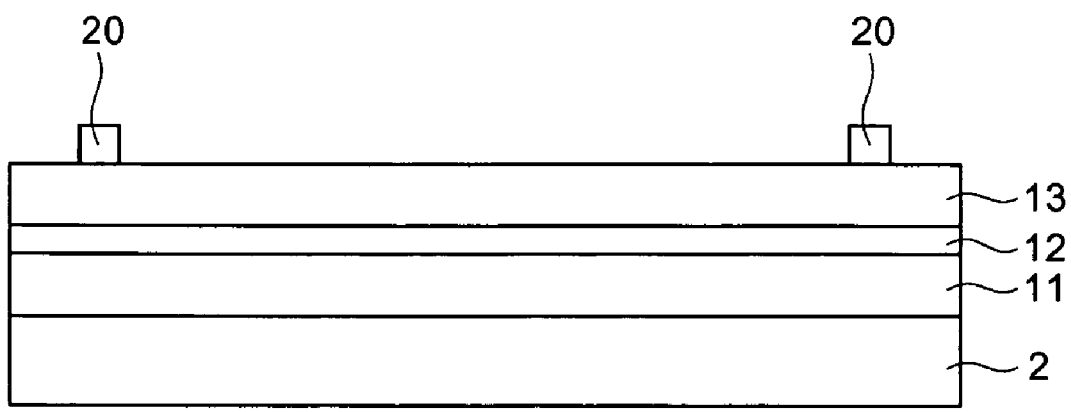
FIG. 4 is a sectional view showing the process subsequent to the process of FIG. 2.
Figure 5:
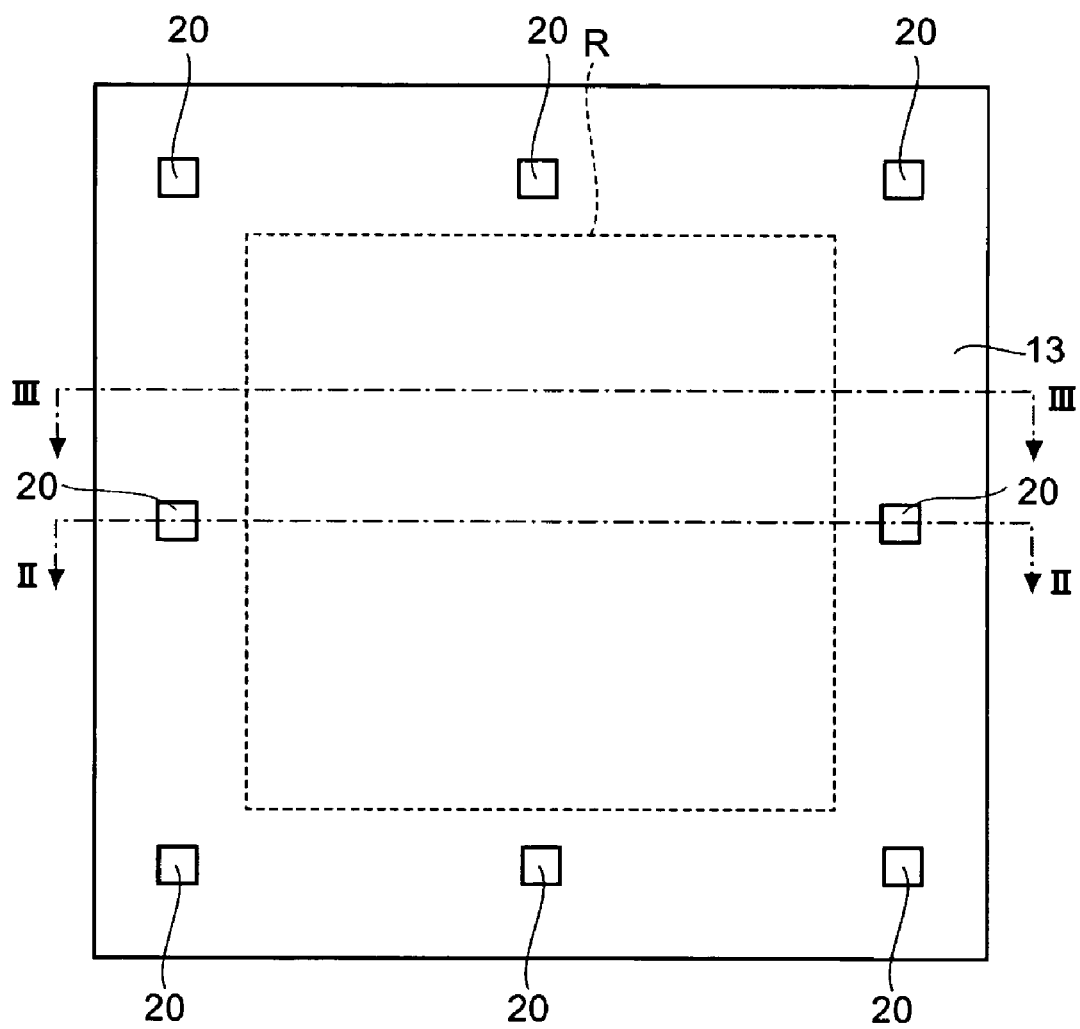
FIG. 5 is a diagram showing the arrangement of the stoppers on the surface of the optical grating layer.

After the layers including the optical grating layer 13 are formed as described above, a dielectric film layer made of silicon nitride ($Si_3N_4$) is formed on the optical grating layer 13. Then, the dielectric film layer is etched to form stoppers 20 using a given resist mask, as shown in FIG. 4. Thus, stoppers (i.e., projections) 20 made of a silicon nitride ($Si_3N_4$) dielectric film layer are formed on the optical grating layer 13. The stoppers 20 are formed in a rectangular parallelepiped shape having a thickness of 10 nm and a side length of 1 μm, for example. The stoppers 20 are arranged in a region outside of the region R where the optical grating G are to be formed on the optical grating layer 13, for example, as shown in FIG. 5.

[Process of Forming a Mask Layer]

Figure 6:
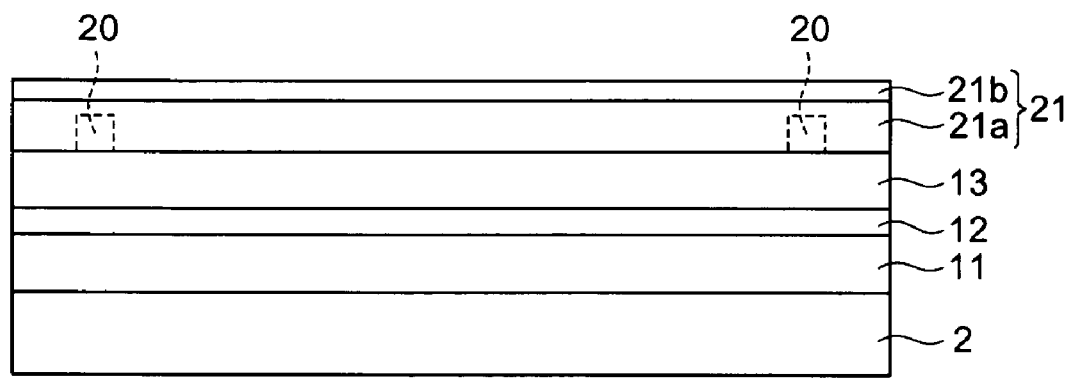
FIG. 6 is a sectional view taken along the line II-II of FIG. 5 and showing the processes performed subsequent to the process of FIG. 4.

After the stoppers 20 are formed, an etching mask layer 21 made of resin is formed on the surface of the optical grating layer 13 as shown in FIG. 6. The etching mask layer 21 is formed by a spinner, for example. FIG. 6 shows a sectional view taken along the line II-II of FIG. 5.

The etching mask layer 21 is composed of two layers: a first layer 21a formed on the optical grating layer 13; and a second layer 21b formed on the first layer 21a. The first layer 21a is formed on the optical grating layer 13 so as to have a thickness that is greater than the thickness of a stopper 20. Therefore, the stopper 20 is buried in the first layer 21a. The first layer 21a has a thickness of about 50 nm to 100 nm, for example.

The first layer 21a has a larger etching rate than that of the second layer 21b when dry etching is performed using $O_2$ plasma, for example. More specifically, a resin that contains polyacrylate as a major ingredient can be adopted for the first layer 21a, and a UV-curing resin that contains a silylation product as a major ingredient can be adopted for the second layer 21b, for example. The etching ratio of the first layer 21a and the second layer 21b is, for example, 10:1 in dry etching process using $O_2$ plasma. The thickness of the second layer 21b is about 100 nm, for example. As for the UV-curing resin, it is possible to use acrylic resin, epoxy resin, polyester resin, etc.

[Stamping Process]

Figure 7:
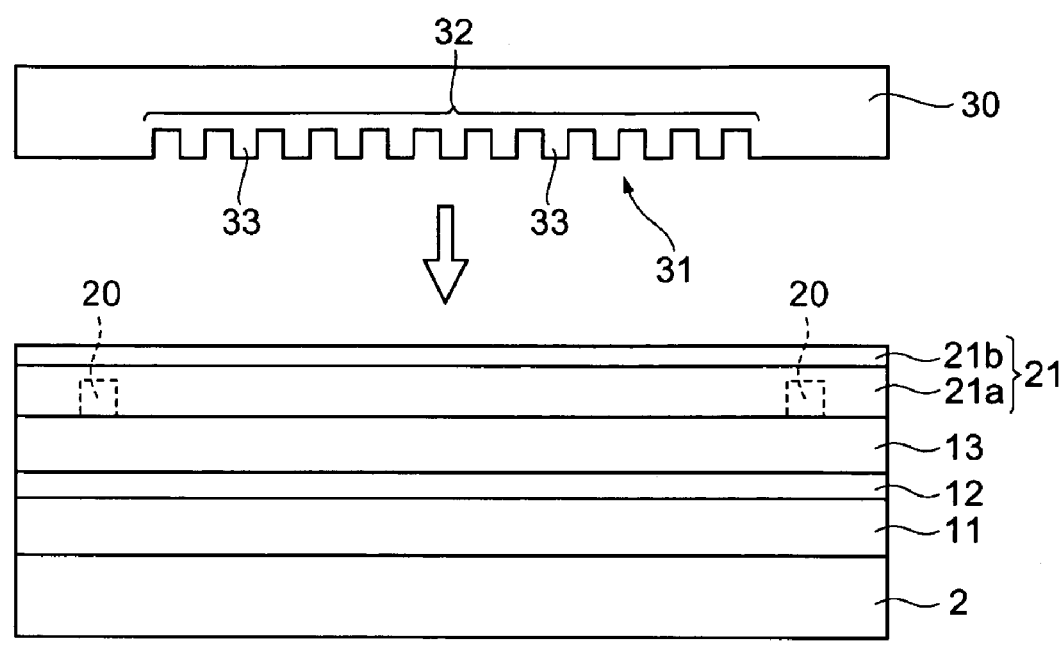
FIG. 7 is a sectional view taken along the line II-II of FIG. 5 and showing the processes subsequent to the process of FIG. 6.

In a stamping process, a nano-stamper 30 is prepared as shown in FIG. 7. The nano-stamper 30 is made of silica, for example. The nano-stamper 30 is transparent to ultraviolet rays and easy to process because of having suitable mechanical strength. A stamping face 31 is provided at a central portion of the bottom face of the nano-stamper 30. The stamping face 31 has a side length of 10 mm, for example.

A corrugation pattern 32 that corresponds to a corrugation pattern 15 (see FIG. 2) that is to be formed on the optical grating layer 13 is formed in a predetermined direction on the stamping face 31. The height of the corrugation pattern 32 is 200 nm, for example. Also, the pitch of the corrugation is 120 nm, for example.

Figure 8:
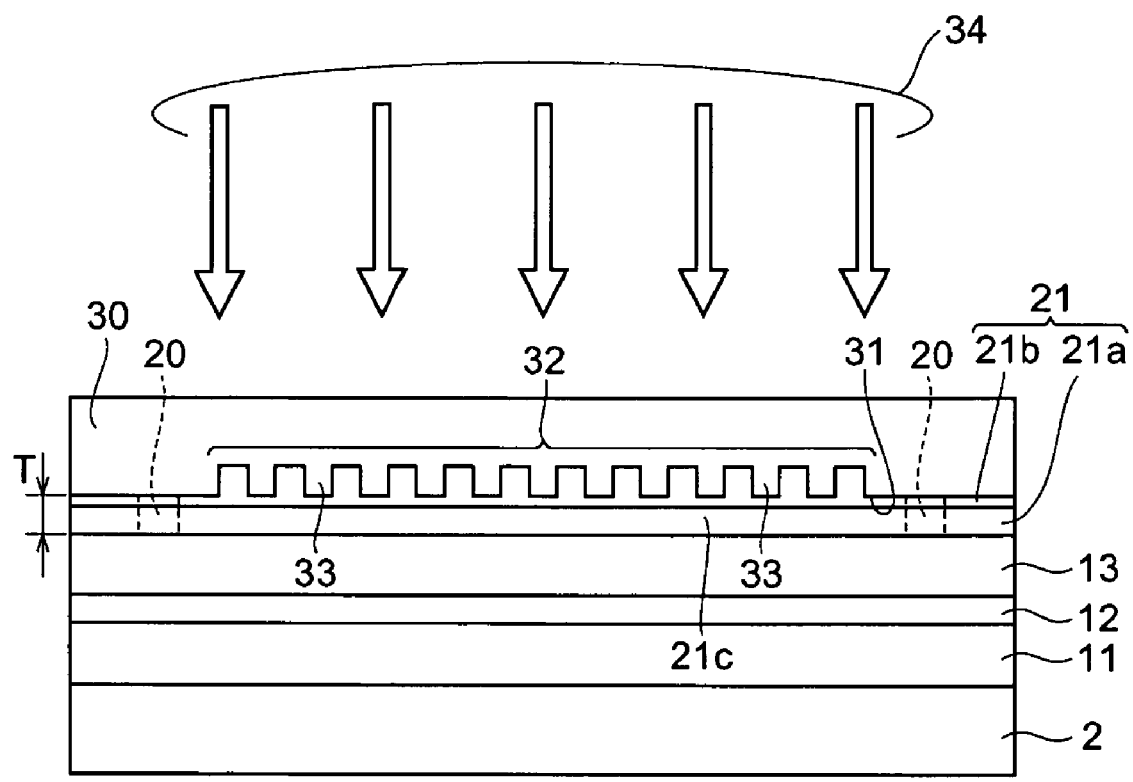
FIG. 8 is a sectional view taken along the line II-II of FIG. 5 and showing the processes subsequent to the process of FIG. 7.

The nano-stamper 30 is pushed to the surface of the etching mask layer 21 as shown in FIG. 8 such that the corrugation pattern 32 lies along the longitudinal direction of the semiconductor mesa part 3 to be formed. FIG. 8 shows a section taken along the line II-II of FIG. 5. The external force applied to the nano-stamper 30 is, for example, 0.05 kN to 1.0 kN.

When the nano-stamper 30 is pushed, the nano-stamper 30 can move until the region existing outside of the stamping face 31 on the bottom face of the nano-stamper 30 contact with the top surface of the stoppers 20. The maximum stroke of the nano-stamper 30 is regulated by the stoppers 20. Accordingly, the remaining layer 21c of the etching mask layer 21 remains, and the remaining layer 21c has a predetermined thickness which equal to or more than the thickness of the stoppers 20. The remaining layer 21c is composed of the layer 21d of the first layer 21a and a part of the second layer 21b which exists between the top surface of the corrugation 33 of the stamping face 31 and the surface of the first layer 21a. Since the height of the stopper 20 is 10 nm, the thickness T of the remaining layer 21c becomes equal to or more than 10 nm.

Next, ultraviolet rays 34 are irradiated from a position above the nano-stamper 30 under pressing the nano-stamper 30 on the etching mask layer 21. Thus, the second layer 21b made of a UV-curing resin is hardened by the ultraviolet rays 34 that have penetrated through the nano-stamper 30.

[Remaining Layer Removing Process]

Figure 9A:
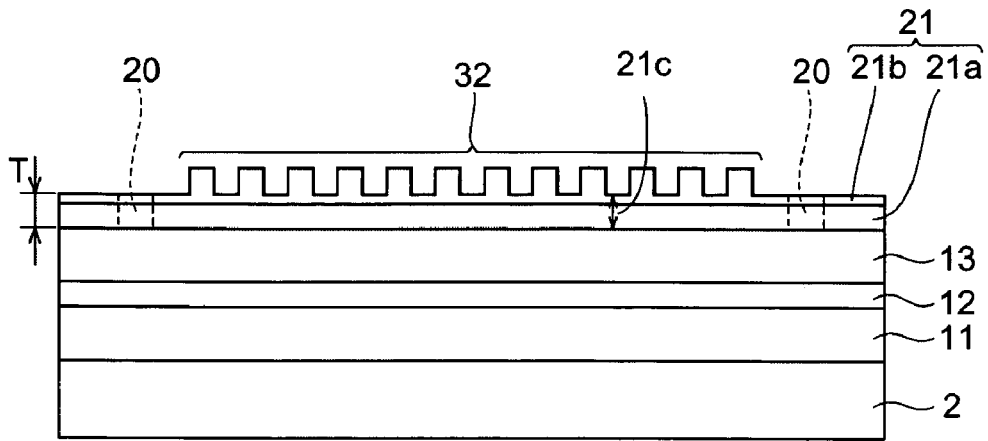
FIG. 9a is a sectional view taken along the line II-II of FIG. 5 and showing the processes subsequent to the process of FIG. 8.
Figure 9B:
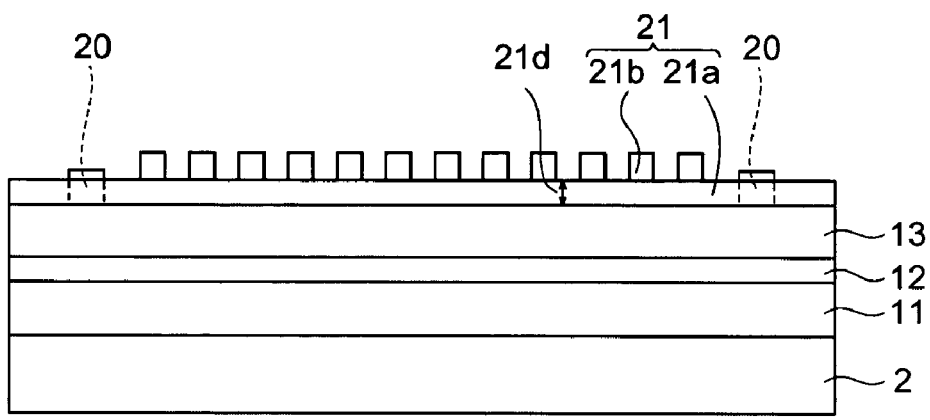
Figure 9C:
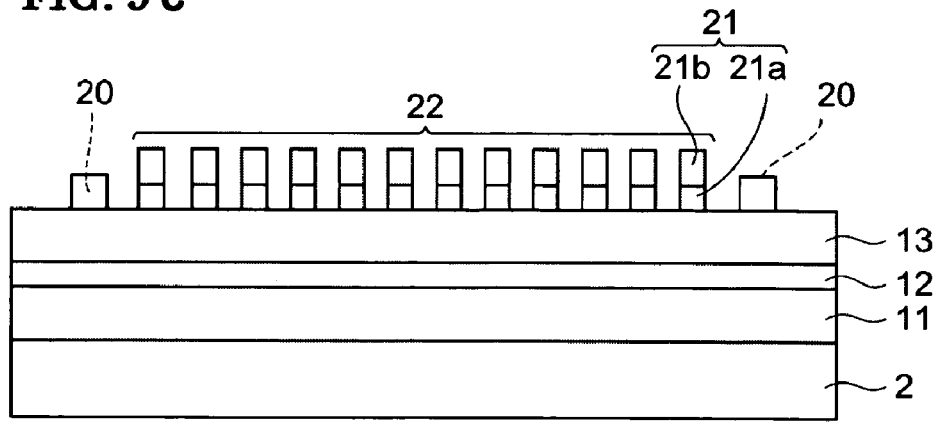
FIG. 9c is a sectional view taken along the line II-II of FIG. 5 and showing the processes subsequent to the process of FIG. 9b.

After the stamping process, the nano-stamper 30 is detached from the etching mask layer 21, as shown in FIG. 9a. The corrugation pattern is formed on the etching mask layer 21. The remaining layer 21c is, however, remained on the optical grating layer 13. To remove the remaining layer 21c, the etching mask layer 21 is etched at two step dry etching process. First, the second layer 21b of the remaining layer 21c is etched by the dry etching process using $CF_4$ plasma until the first layer 21a is exposed, as shown in FIG. 9b. The ratio between the etching rate of the first layer 21a and the second layer 21b in the dry etching process using $CF_4$ plasma is set to be about 1:10. Therefore, in the dry etching process using the $CF_4$ plasma, the second layer 21b is selectively etched. And the dry etching process automatically stops, when the first layer 21a is exposed. Thereafter, the layer 21d, that is the first layer 21a in the remaining layer 21c, is etched by the dry etching process using $O_2$ plasma until the optical grating layer 13 is exposed. As a result, the etching mask layer having a corrugation pattern 22 is formed on the surface of the optical grating layer 13, as shown in FIG. 9c. The corrugation pattern 22 corresponds to a reversed shape of the corrugation pattern 32 of the stamping face 31. FIG. 9a, FIG. 9b and FIG. 9c show a section taken along the line II-II of FIG. 5.

The thickness of the second layer 21b made of a UV-curing resin in the remaining layer 21c is only about 60 nm after pressing the nano-stamper 30 at this embodiment, and therefore the shape of the corrugation pattern of the etching mask layer 21 is hardly deformed in the dry etching process using $CF_4$ plasma. On the other hand, the layer 21d, that is the first layer 21a in the remaining layer 21c, is etched by the dry etching process using $O_2$ plasma. In the dry etching process using $O_2$ plasma, the etching ratio between the first layer 21a and the second layer 21b is set to be 10:1. As a result, the second layer 21b is hardly etched in the dry etching process using $O_2$ plasma.

Therefore, the second layer 21b works as an etching mask of the first layer 21a for performing the dry etching process using $O_2$ plasma. Furthermore, a side etching of the second layer 21b can be restrained. As a result, when the layer 21d, that is the first layer 21a in the remaining layer 21c, is removed by the etching process using $O_2$ plasma, the shape and pitch of the corrugation pattern of the etching mask layer 21 do not change, being exactly maintained.

[Optical Grating Forming Process]

After the stamping process, the surface of the optical grating layer 13 is etched by wet etching process for about one minute. The etching mask layer 21 having the corrugation pattern 22 is used as the etching mask. A liquid mixture containing saturation bromine water, hydrogen bromide, and water at the ratio of 1:10:400 is used for an etchant, for example.

Figure 10:
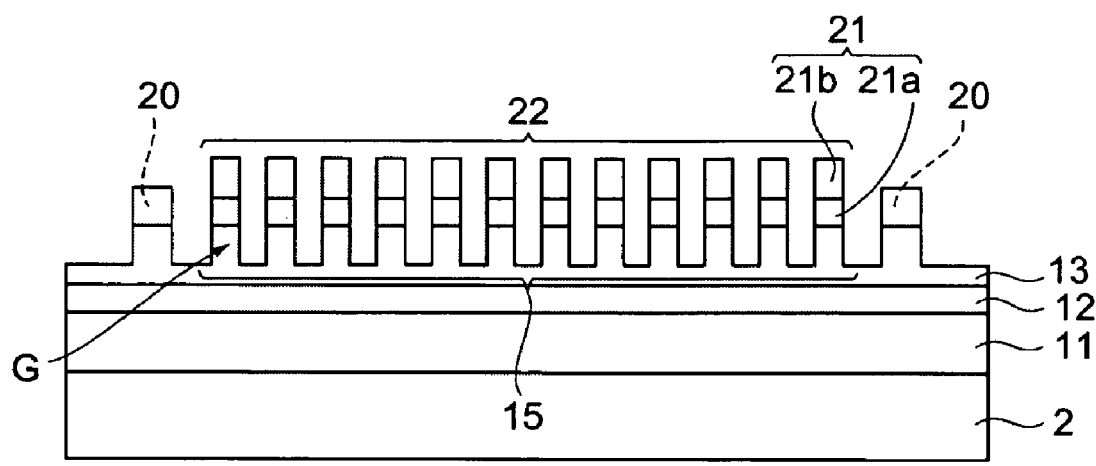
FIG. 10 is a sectional view taken along the line II-II of FIG. 5 and showing the processes subsequent to the process of FIG. 9c.

As shown in FIG. 10, the optical grating G having a corrugation pattern 15 is formed on the optical grating layer 13. The corrugation pattern 15 is reverse to the corrugation pattern 32 of the stamping face 31. The depth of the optical grating formed on the optical grating layer 13 is about 30 nm. FIG. 10 shows a section taken along the line II-II of FIG. 5.

The optical grating G may be also formed by using dry etching process instead of the wet etching process. In such case, the etching mask layer 21 having the corrugation pattern 22 may be used as the mask of the dry etching process as well as the wet etching process. In this case, the optical grating G is formed by etching the optical grating layer 13 for about 3 to 6 minutes. As for the dry etching, for example, a reactive ion etching (RIE) dry-etching process, especially an inductively coupled plasma (ICP) with low process pressure of 1 Pa to 3 Pa, can be used.

An ICP apparatus with two RF power supplies of bias power supply and ICP power supply to generate the plasma is preferably used for the ICP-RIE dry-etching process. The bias power from the bias power supply is controlled in the range of 10 W to 30 W, and the ICP power is controlled in the range of 100 W to 150 W, for example. As for the etching gas, a mixed gas of methane and hydrogen is used. The mixing ratio of methane and hydrogen is preferably about 1 to 3. Using such dry etching, the corrugation pattern of the optical grating G can also be formed with precision.

[Mesa Part Forming Process]

Figure 11:
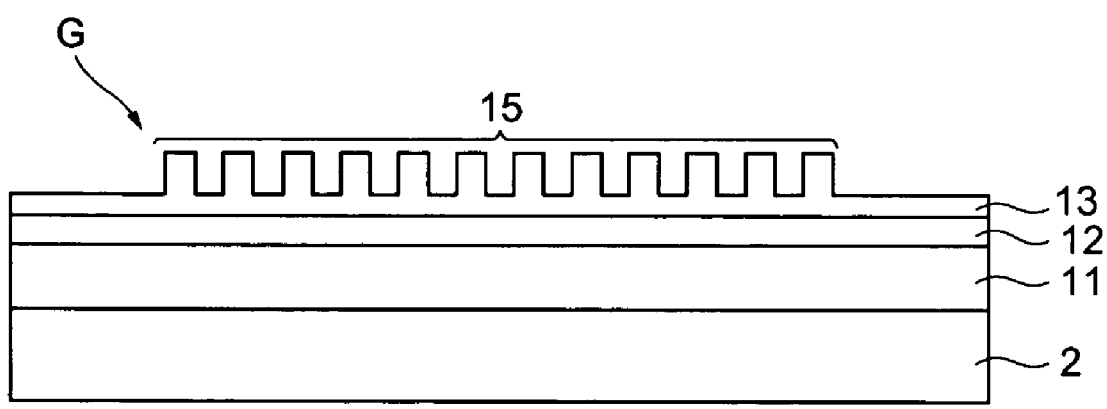
FIG. 11 is a sectional view taken along the line III-III of FIG. 5 and showing the processes subsequent to the process of FIG. 10.

FIG. 11 is a sectional view taken along the line III-III of FIG. 5 for illustrating the processes performed subsequent to the process of forming the optical grating G. As shown in FIG. 11, the etching mask layer 21 and the stopper 20 are removed by the dry etching process using the plasma. The gas mixture of a fluorine-based gas and an oxygen gas is used for the dry etching process. Then, the cladding layer 14 is formed on the surface of the optical grating layer 13 by the MOCVD method, for example.

Next, a stripe mask is formed on the cladding layer 14, and this mask is used for etching the cladding layer 11, the optical grating layer 13, and the active layer 12. The dielectric film such as silicon nitride ($Si_3N_4$) or silicon oxide ($SiO_2$) can be used as the material of the mask. Thus, the semiconductor mesa part 3 with a stripe-shape is formed on the semiconductor substrate 2.

Figure 12:
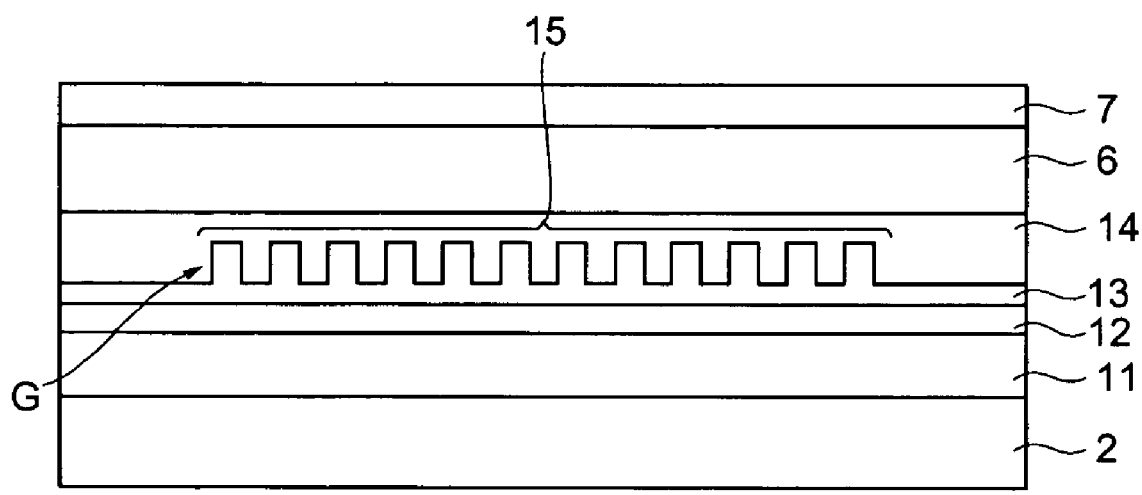
FIG. 12 is a sectional view taken along the line III-III of FIG. 5 and showing the processes subsequent to the process of FIG. 11.

Next, the buried layers 4 and 5 are formed on both sides of the semiconductor mesa part 3 by the MOCVD method, for example. Then, the cladding layer 6 and the contact layer 7 are formed to cover the semiconductor mesa part 3 and the buried layers 4 and 5 as shown in FIG. 12. FIG. 12 is a sectional view taken along the line III-III of FIG. 5. Subsequently, electrodes 8 and 9 are formed on the surface of the contact layer 7 and the rear surface of the semiconductor substrate 2, respectively.

Also, the anti-reflection coating film 10 and the high-reflection coating film 10' are formed on the end facet of the semiconductor laser device 1. As a result, the semiconductor laser device 1 shown in FIGS. 1 and 2 are completed.

As described above, in the method of manufacturing the semiconductor device of the present invention, the remaining layer 21c of the etching mask layer 21 is made to remain in a thickness of 10 nm or more. The remaining layer 21c of the etching mask layer 21 works as the cushion when the stamping face 31 of the nano-stamper 30 is pressed on the surface of the etching mask layer 21. Therefore, the stress added to the nano-stamper 30, the semiconductor substrate 2 and the epitaxial layers including active layer 12 is reduced. In other words, it is possible to reduce the strain caused by the stress when the stamping face 31 of the nano-stamper 30 is pressed on the surface of the etching mask layer 21. Consequently, it is possible to suppress that the crystal defect is introduced in the semiconductor substrate 2 and the active layer 12. Also, the degradation of the light emitting property of the semiconductor laser device 1 can be restrained. Moreover, the damage of the nano-stamper 30 can be restrained, and therefore extra steps such as the replacement of the nano-stamper 30 can be avoided.

Also, in the method of manufacturing the semiconductor device of the present invention, the stoppers 20 having a height of 10 nm or more are formed in the region outside of the region in which the optical grating G is to be formed. Therefore, when the nano-stamper 30 is pressed, the stroke of the nano-stamper 30 is automatically regulated because the region existing outside the stamping face 31 in the bottom face of the nano-stamper 30 contacts with the top surfaces of the stoppers 20. Therefore, the remaining layer 21c of the etching mask layer 21 can surely be left in a thickness of 10 nm or more.

However, it is necessary to remove the remaining layer later so as to form an optical grating. If a single layer of the etching mask layer 21 is formed on the surface of the optical grating layer 13, the whole of the etching mask layer having the corrugation pattern is also etched. Therefore, the shape of the corrugation pattern formed in the etching mask layer might be deformed, resulting in failure to maintain the corrugation pattern correctly.

In this embodiment of the present invention, however, the etching mask layer 21 is constituted of two layers so as to prevent the deformation of the corrugation pattern of the etching mask layer 21 in the remaining layer removing process. More specifically, the etching mask layer 21 to be formed on the surface of the optical grating layer 13 is constituted by two layers: a second layer 21b made of a UV-curing resin and a first layer 21a made of a resin whose etching rate of dry etching process using $O_2$ plasma is larger than the second layer 21b. With such layer constitution, after the stamping is made by the nano-stamper 30, the corrugation pattern is transferred to the etching mask layer 21. Then, the remaining layer 21c of the etching mask layer 21 is formed on the optical grating layer 13. The remaining layer 21c is composed of the first layer 21a and a part of the second layer 21b. The second layer 21b in the remaining layer 21c is thinner than 100 nm, for example. To remove the remaining layer 21c, the etching mask layer 21 is etched at two step dry etching process. First, the second layer 21b in the remaining layer 21c is etched by the dry etching process using $CF_4$ plasma. The second layer 21b in the remaining layer 21c is so thin that it is shortly removed without deforming the corrugation pattern formed on the etching mask layer 21. Next, the first layer 21a in the remaining layer 21c is selectively removed by dry etching process using $O_2$ plasma. In the dry etching process using $O_2$ plasma, the second layer 21b at the upper portion of the corrugation pattern 22 works as the mask, and consequently the side-etching of the corrugation pattern 22 of the etching mask layer 21 can be restrained. As a result, the pitch and shape of the corrugation pattern 22 of the etching mask layer 21 hardly change, and the size of the corrugation pattern 22 of the etching mask layer 21 is precisely maintained.

Also, since the remaining layer 21c is 100 nm or less in thickness, the remaining layer 21c can be removed by performing the dry etching for a short time. This also contributes to maintain the pitch and shape of the corrugation pattern formed on the etching mask layer 21.

Hereinafter, The verification test of the method relating to the present invention for manufacturing the semiconductor device will be described.

This verification test was performed by measuring the variation in the intensity of photoluminescence (hereinafter, denoted as "PL intensity") from the active layer before and after the stamping of the nano-stamper with respect to samples having the same structure as the semiconductor laser device 1. The existence or non-existence of crystal defects caused in the active layer can be evaluated by measuring the variation in the PL intensity from the active layer before and after the stamping of the nano-stamper. In the example, the remaining layer of the etching mask layer was made to remain in a thickness of 10 nm or more upon the stamping of the nano-stamper. In the comparative example, the remaining layer of the etching mask layer was made to remain in less than 10 nm in thickness. In all of the samples, the standard of PL intensity was determined on the basis of the PL intensity in the region that was not subjected to the stamping of the nano-stamper.

Figure 13:
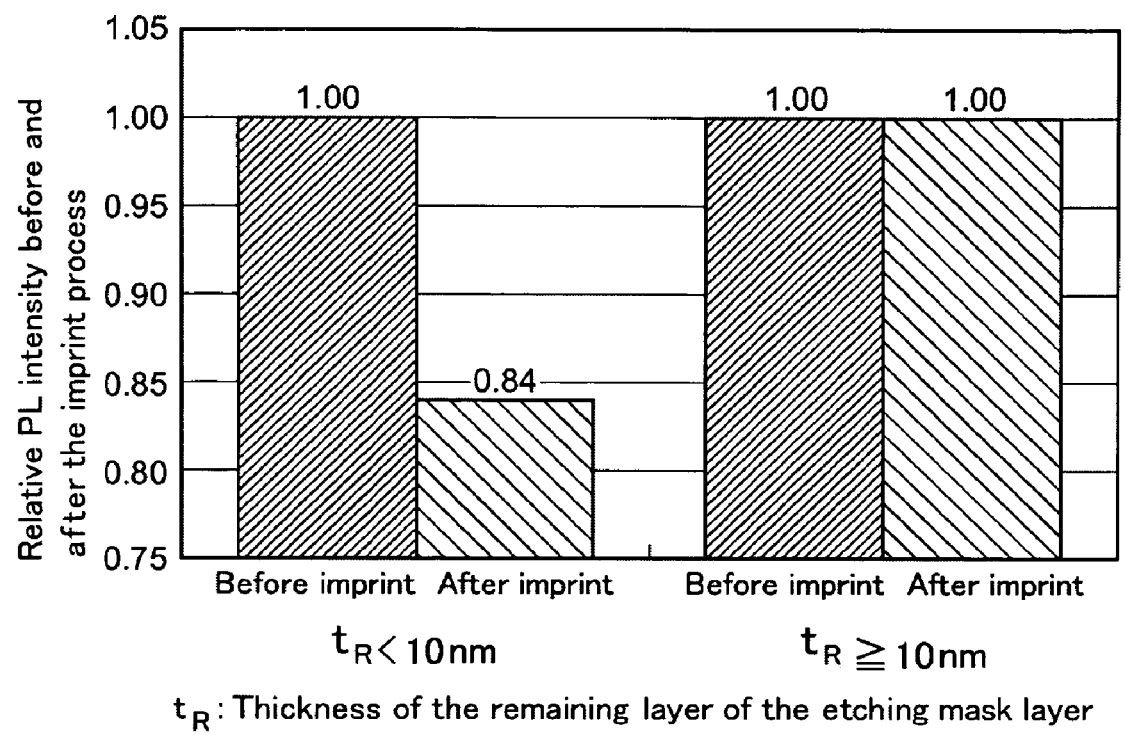
FIG. 13 is a graph showing results of a test performed for the confirmation of the method of manufacturing a semiconductor laser device relating to the present invention.

FIG. 13 shows the test results. As shown in the FIG. 13, in the comparative example, the PL intensity from the active layer measured after the stamping of the nano-stamper was decreased by about 16% as compared with the PL intensity measured before the stamping. On the other hand, in the example, the PL intensity from the active layer measured after the stamping of the nano-stamper was the same as before the stamping of the nano-stamper.

As can be seen from the above results, it is important that the remaining layer of the etching mask layer existing from the top surface of the corrugation of the stamping face to the surface of the optical grating layer is formed. The remaining layer has a predetermined thickness when the stamping face of the nano-stamper is pressed on the surface of the etching mask layer. For example, the thickness of the remaining layer of the etching mask layer, $t_R$, is preferably 10 nm or more. It was confirmed that this can prevent the degradation of the optical characteristics of the semiconductor laser device by reducing the stress added to the nano-stamper and the semiconductor substrate. To introduce the strain and the damage in the active layer can be suppressed by reducing the stress added to the semiconductor substrate. Accordingly, the non-radiative recombination due to a crystal defect can be reduced, resulting in the prevention of the degradation in the PL intensity.

The present invention is not limited to the above embodiments. For example, although an explanation of DFB-LD devices was given in the above-mentioned embodiments, the method of the present invention for manufacturing semiconductor devices can also be applied to a distributed Bragg reflector laser diode (DBR-LD) and an optical waveguide device with the optical grating, if it is used in the case of forming an optical grating with nano-imprint on a semiconductor substrate.

Figure 14:
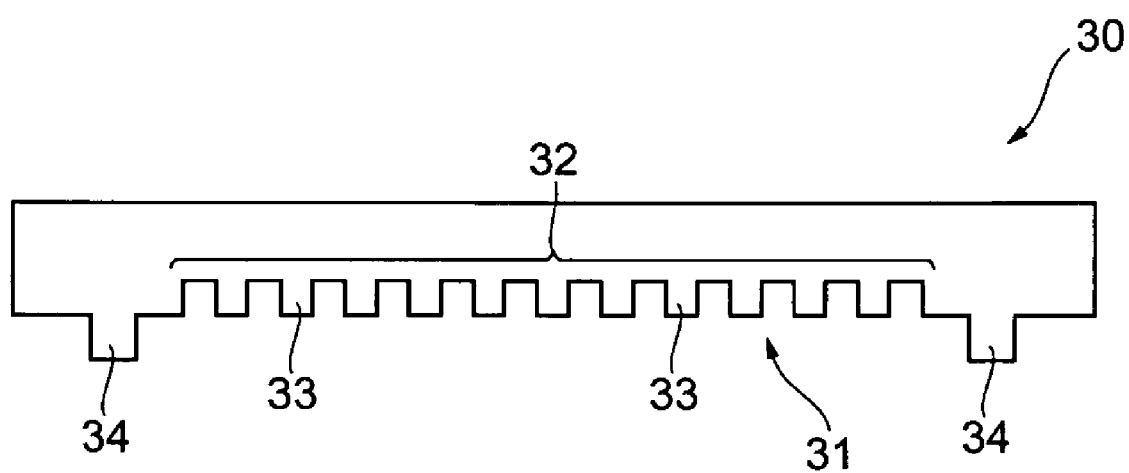
FIG. 14 is a diagram showing a modified example of stoppers formed on a nano-stamper.

Also, in the above-mentioned embodiments, the stoppers 20 made of silicon nitride ($Si_3N_4$) are provided on the surface of the optical grating layer 13. However, as shown in FIG. 14, stoppers 35 may be provided in a region outside the stamping face 31 on the nano-stamper 30 such that the height of the stoppers 35 from the stamping face 31 is higher than a given value, e.g. 10 nm or more. In this case also, when the nano-stamper 30 is pressed, the nano-stamper 30 can move until the bottom faces of the stoppers 35 contact with the surface of the optical grating layer 13. Consequently, the maximum stroke of the nano-stamper 30 is regulated, whereby the remaining layer 21c of the etching mask layer 21 can surely be allowed to have a predetermined thickness.

Further, an example shown in the above-mentioned embodiments is such that the etching mask layer 21 has a two-layer structure: a first layer 21a is made of a resin containing polyacrylate as a major ingredient; and a second layer 21b is made of a UV-curing resin containing silylation product as a major ingredient. However, it is possible to use an etching mask layer made of one ordinary UV-curing resin layer. In this case, the remaining layer can be removed by dry etching using $O_2$ plasma. Although the precision of the corrugation pattern formed on the etching mask layer may probably be less satisfactory as compared with the above embodiments, it is useful for the application for fabricating the semiconductor device with the optical grating not to require so high precision of the corrugation pattern.

Furthermore, The present invention is also used for a thermal nano-imprint method in addition to an optical (UV) nano-imprint method. In the above-mentioned embodiments, it is possible to use an etching mask layer made of a thermal curing resin layer for a thermal nano-imprint method.

From the invention thus described, it will be obvious that the invention may be varied in many ways. Such variations are not to be regarded as a departure from the scope of the invention, and all such modifications as would be obvious to one skilled in the art are intended for inclusion within the scope of the following claims.

What is claimed is:

1. A method of manufacturing a semiconductor device including an optical grating having a periodic corrugation pattern, the method comprising the steps of:
   forming an optical grating layer on a semiconductor substrate;
   forming an etching mask layer on the optical grating layer;
   preparing a nano-stamper having a stamping face including a periodic corrugation pattern, and subsequently pressing the stamping face of the nano-stamper onto a surface of the etching mask layer such that a remaining layer, from a top surface of corrugation of the stamping face of the etching mask layer to a surface of the optical grating layer, remains with a predetermined thickness;
   forming a mask pattern by removing the remaining layer of the etching mask layer by dry etching using plasma; and
   forming an optical grating on the optical grating layer by etching the optical grating layer using the etching mask layer as a mask, wherein
   the etching mask layer comprises a first layer formed on the optical grating layer and a second layer formed on the first layer, and
   the second layer is made of a UV-curing resin and the first layer is made of a resin that exhibits an etching rate greater than the second layer at a time of dry etching of the first layer.

2. A method of manufacturing a semiconductor device according to claim 1, wherein the remaining layer of the etching mask layer is 10 nm or more and 100 nm or less in thickness.

3. A method of manufacturing a semiconductor device according to claim 1, wherein the UV-curing resin of the second layer of the etching mask layer contains silylation product as a major ingredient, and the dry etching of the first layer is performed using $O_2$ plasma.

4. A method of manufacturing a semiconductor device according to claim 3, wherein an etching rate of the second layer is greater than that of the first layer at a time of dry etching of the second layer, and the dry etching of the second layer is performed using $CF_4$ plasma.

5. A method of manufacturing a semiconductor device according to claim 1, wherein a stopper having a predetermined thickness is integrally formed in a region outside the stamping face on the nano-stamper.

6. A method of manufacturing a semiconductor device according to claim 5, wherein a height of the stopper is equal to or more than 10 nm.

7. A method of manufacturing a semiconductor device according to claim 5, wherein the first layer is formed in a thickness greater than a height of the stopper formed on the nano-stamper.

8. A method of manufacturing a semiconductor device according to claim 1, wherein a step of forming a stopper in a region outside of a region where the optical grating is to be formed on the optical grating layer is provided between the optical grating layer forming step and the mask layer forming step.

9. A method of manufacturing a semiconductor device according to claim 8, wherein a dielectric film made of silicon nitride, silicon oxide, or silicon oxynitride is used as a material for making the stopper.

10. A method of manufacturing a semiconductor device according to claim 8, wherein the thickness of the stopper is equal to or more than 10 nm.

11. A method of manufacturing a semiconductor device according to claim 8, wherein the first layer is formed in a thickness greater than a thickness of the stopper.

* * * * *